United States Patent
Emer et al.

(10) Patent No.: US 7,436,521 B2
(45) Date of Patent: Oct. 14, 2008

(54) OPTICAL MEASURING APPARATUS AND OPERATING METHOD FOR IMAGING ERROR CORRECTION IN AN OPTICAL IMAGING SYSTEM

(75) Inventors: Wolfgang Emer, Aalen (DE); Ulrich Wegmann, Koenigsbronn (DE); Martin Schriever, Aalen (DE); Rainer Hoch, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 141 days.

(21) Appl. No.: 11/271,806

(22) Filed: Nov. 14, 2005

(65) Prior Publication Data

US 2006/0119838 A1 Jun. 8, 2006

Related U.S. Application Data

(63) Continuation-in-part of application No. PCT/EP03/04932, filed on May 12, 2003.

(51) Int. Cl.
*G01B 9/02* (2006.01)
*G01B 11/02* (2006.01)
*G03B 27/42* (2006.01)

(52) U.S. Cl. .......................... 356/521; 356/515; 355/53
(58) Field of Classification Search ................. 356/489, 356/495, 515, 520, 521, 124; 355/53
See application file for complete search history.

(56) References Cited

U.S. PATENT DOCUMENTS

| 5,805,273 | A | * | 9/1998 | Unno | .......................... | 355/53 |
| 5,888,675 | A | | 3/1999 | Moore et al. | | |
| 6,521,877 | B1 | * | 2/2003 | Muller-Rissmann et al. | ..... | 250/201.1 |
| RE38,320 | E | * | 11/2003 | Nishi et al. | .................... | 355/53 |

| 2001/0053489 | A1 | 12/2001 | Dirksen et al. |

(Continued)

FOREIGN PATENT DOCUMENTS

DE 101 09 929 A1 11/2001

(Continued)

OTHER PUBLICATIONS

Nigel R. Farrar et al, "In-Situ Measurement of Lens Aberrations", Optical Microlithography XIII, SPIE vol. 4000—The International Society for Optical Engineering, pp. 18-29, Mar. 1, 2000.

*Primary Examiner*—Patrick J Connolly
(74) *Attorney, Agent, or Firm*—Sughrue Mion, PLLC (57) ABSTRACT

A measuring apparatus for optical, for example interferometric, measurement of an optical imaging system, imaging of a useful pattern in an imaging operation, including a device for production of radiation information, for example interference information, which is indicative of imaging errors, having a mask structure arrangement which contains a measurement pattern, and a device for detection and evaluation of the interference information which is indicative of imaging errors; also a method for operation of the optical imaging system including imaging error correction. The apparatus further includes a heating irradiation arrangement for radiation heating of the optical imaging system during measurement operation such that the heating effect of the radiation which is applied to the optical imaging system to be measured equals, within a tolerance range which can be predetermined, the heating effect of the radiation which is passed through the useful pattern during imaging operation of the optical imaging system.

17 Claims, 6 Drawing Sheets

U.S. PATENT DOCUMENTS

| | | | |
|---|---|---|---|
| 2002/0145717 A1* | 10/2002 | Baselmans et al. | 355/53 |
| 2005/0264827 A1 | 12/2005 | Schriever et al. | |
| 2006/0044536 A1* | 3/2006 | Ohsaki | 355/53 |
| 2007/0132972 A1* | 6/2007 | Streefkerk et al. | 355/53 |
| 2008/0049202 A1* | 2/2008 | Kraehmer | 355/30 |

FOREIGN PATENT DOCUMENTS

| | | |
|---|---|---|
| EP | 1 231 517 A1 | 8/2002 |
| EP | 1 670 041 A1 | 6/2006 |
| WO | WO 2005/022614 A1 | 3/2005 |

\* cited by examiner

OPTICAL MEASURING APPARATUS AND OPERATING METHOD FOR IMAGING ERROR CORRECTION IN AN OPTICAL IMAGING SYSTEM

The following disclosure is a continuation-in-part of international patent application no. PCT/EP03/004932, filed on May 12, 2003, which is incorporated into this application by reference.

BACKGROUND OF THE INVENTION

1. Field of the Invention

The invention relates to an optical measuring apparatus for optical, for example interferometric, measuring of an optical imaging system, which is intended for imaging of a useful pattern, and to a method for operation, including imaging error correction, of such optical imaging system.

2. Description of the Related Art

The imaging quality of optical imaging systems is subject to requirements which are becoming ever more stringent. One example of this is projection objectives for microlithographic production of semiconductor components and other finely structured components, which structures should be largely free of imaging errors in the submicrometer range. Since, because of the complex optical design, it is generally impossible to derive the optical characteristics of the objectives from theoretical calculations, reliable measurement of the optical characteristics is necessary before, and in some cases also even during, operation at the point of use, for example in a so-called wafer scanner for wafer exposure.

Interferometric measurement methods are frequently used for this purpose. An apparatus which operates in the manner of a Shearing interferometer for wavefront detection and which allows rapid, high-precision measurement of high-resolution photolithographic projection objectives, is described in the Laid-Open publication DE 101 09 929 A1. Measuring devices such as these typically contain a wavefront source on the object side, that is to say on the object side of the optical imaging system to be measured, in order to produce at least one radiation wavefront, which passes through the imaging system, and a diffraction grating on the image side, that is to say on the image side of the optical imaging system to be measured, as well as a position-resolving detector, which is arranged downstream from this diffraction grating, for provision and detection of interferometric information which is indicative of imaging errors in the system to be measured. The imaging errors can be determined from the detected interference information by suitable evaluation means.

By way of example, a so-called source or wavefront module can be used as an illumination module as the wavefront source, which is connected to an illumination section and has a measurement mask in the form of a so-called hole or coherent mask, which has a suitable measurement pattern. If required, the illumination part may correspond to that which is associated with the optical imaging system at its intended point of use, for example in a microlithography system. In this case, the measuring device can be integrated in the microlithography system, and all that is necessary in each case to carry out a measurement is just to replace the useful mask, to which the useful pattern is applied, by the illumination module, and to introduce the detector instead of a wafer.

Furthermore, the prior German Patent Application 102 17 242.0 proposes the capability to measure the optical imaging system by means of Shearing interferometry during its normal operation, for which purpose a mask is provided for the wavefront source, on which mask a measurement pattern is formed in addition to a useful pattern. The interference information which is obtained in this way during normal imaging operation of the optical imaging system, and which is indicative of aberrations in the imaging system, is evaluated by an evaluation unit and is used for correction of the aberrations that are found, for which purpose an appropriate aberration closed-loop or open-loop control system is provided.

In addition to such interferometric measurement methods, non-interferometric measurement methods are also used for aberration determination, for example on projection objectives of microlithographic projection exposure systems, such as the Shack-Hartmann method.

As the imaging quality requirements become more stringent, particularly for projection objectives in microlithography, imaging errors or aberrations resulting from the so-called heating effect or "lens-heating" effect are no longer intrinsically negligible, with these expressions meaning a change in the imaging characteristics of the microlithography projection objective or of some other optical imaging system resulting from interaction between the radiation that is used and the objective and/or those system components which are active for imaging purposes. One difficulty in the determination of these heating-dependent imaging errors is that this effect often decays very quickly when the irradiation is ended. Thus, if the system components which are active for imaging purposes are first of all irradiated intensively, for example with a radiation intensity which is comparable to that during normal operation, and the irradiation is then stopped in order subsequently to measure the heating-dependent imaging errors, these measurement results represent the imaging errors that occur during normal irradiation operation only to a very restricted extent.

It is an object of the invention to provide a measuring apparatus of the type mentioned initially as well as a method for operation of an optical imaging system, including imaging error correction, whose imaging errors can be determined using such measuring apparatus, by means of which the heating-dependent imaging errors can be determined comparatively easily and reliably, and can be taken into account for correction purposes.

SUMMARY OF THE INVENTION

The invention achieves this problem by providing a measuring apparatus comprising a device for production of radiation information which is indicative of imaging errors in a measurement operation, with this device containing mask structure arrangement with a measurement pattern, and comprising a detection and evaluation device for detection and evaluation of the radiation information which is indicative of imaging errors. The apparatus further comprises a heating irradiation arrangement for radiation heating of the optical imaging system during measurement operation such that the heating effect of the radiation applied to the optical imaging system to be measured equals, within a predeterminable tolerance range, the heating effect of the radiation which is passed through the useful pattern during the imaging operation of the optical imaging system.

The measuring apparatus of the invention thus contains a heating irradiation arrangement chosen such that the heating effect of the radiation which is passed through the imaging system in a measurement operation corresponds, within a tolerance range which can be predetermined, to the heating effect of the radiation which is passed through the useful pattern during normal imaging operation of the optical imaging system. In consequence, the optical imaging system is actually subject to the typical beam load during the measurement process, with this beam load being that to which it is subject during normal imaging operation. In consequence, the heating-dependent imaging errors and the imaging errors which are dependent on the radiation intensity are substantially the same during the measurement process as those which occur during normal operation of the imaging system. The imaging errors which are caused by the radiation load during normal operation of the optical imaging system can thus be determined very realistically and accurately by means of this measuring device, preferably on a position-resolved and/or time-resolved basis. The measuring device according to the invention is suitable for both interferometric and non-interferometric optical measurement methods.

In one embodiment of the invention the heating irradiation arrangement comprises a heating irradiation pattern on a mask structure element chosen such that the heating effect of the radiation passed through this heating irradiation pattern is substantially equal to the heating effect of the radiation used in the normal imaging operation, within said tolerance range. The heating irradiation pattern and the measurement pattern may both be provided on a common mask, with the measurement pattern preferably occupying only a relatively small mask subarea, while the heating irradiation pattern extends over the remaining, effective mask area. Alternatively, the measurement pattern may be provided on its own mask, which is placed on the object side or image side, alongside or in front of or behind a mask to which the heating irradiation pattern is fitted.

In an alternative embodiment the heating irradiation arrangement comprises a beam forming assembly adapted to simulate the irradiation condition in the normal imaging operation when the useful pattern is applied, this simulation in particular referring to the angle distribution and thus the spatial coherence as well as to the spatially-dependent and thus field-dependent radiation intensity. In this embodiment the heating effect caused by the radiation passed through the useful pattern in the normal imaging operation is thus simulated by an appropriately formed radiation heating beam in the measurement operation without needing to use a heating irradiation mask pattern.

The tolerance range within which the radiation load acting on the optical imaging system must correspond to that during normal operation can be chosen appropriately depending on the application, preferably based on the useful pattern or patterns which is or are typically used during operation of the optical imaging system. Thus, for example, the heating irradiation pattern may be identical to an individual useful pattern that is used or to a representative (which is typical in terms of radiation transmission) of a group of different useful patterns which are intended to be imaged by the optical imaging system. Furthermore, a coarsened structure which is simpler than that of a typical useful pattern, can be used as the heating irradiation pattern, provided that the effect of the radiation transmitted by it with respect to the "lens-heating" effect that causes imaging errors corresponds to the radiation passed through the useful pattern within tolerance limits which can be predetermined. This can be determined, for example, by simple calculations or experiments.

In a further refinement of the invention, the heating irradiation arrangement is chosen on the basis of the criterion that it produces a diffraction pattern in a pupil plane of the optical imaging system, which diffraction pattern corresponds, within a tolerance range which can be predetermined, to a diffraction pattern which is produced by the useful pattern. This ensures that the heating-dependent imaging errors during the measurement process are essentially the same as those during operation of the imaging system.

In a further refinement, the measuring apparatus comprises a screen arrangement in front of the detection and evaluation means, in order to pass that radiation component which contains the radiation information that is indicative of imaging errors, and at the same time to mask out the radiation which is produced by the heating irradiation arrangement and is used to achieve the heating effect, before the detection means, and thus to avoid superimposition at the detector of the radiation information which is indicative of imaging errors. The screen arrangement may be adapted to block specifically polarized light of the heating irradiation arrangement while passing differently polarized measuring radiation. According to still another embodiment the screen arrangement may be adapted to provide for the necessary separation of the measurement radiation from the heating irradiation spatially or by time switching, i.e. in the latter case the measurement radiation and the heating irradiation may be applied alternately in time.

According to further preferred embodiments of the invention, there are various possibilities to direct the measurement radiation on the one hand and the heating irradiation on the other hand through the optical imaging system to be measured. In one type of measuring apparatus the heating irradiation is laterally coupled into the system on the object side of the optical imaging system while the measuring radiation is incident in the longitudinal direction parallel to the optical axis of the optical imaging system. In another type of measuring apparatus the measuring radiation is laterally coupled into the system while the heating irradiation is incident parallel to the optical system axis. For both of these types the measurement radiation and the heating irradiation are passed through the optical imaging system to be measured in the same direction. In still other embodiments the measuring radiation is passed through the optical imaging system in the direction opposite to that of the heating irradiation. This may e.g. be done by directing the measuring radiation from the image side to the object side of the optical imaging system while directing the heating irradiation from the object side to the image side, or vice versa. Also in these embodiments the measurement radiation and/or heating irradiation may laterally be coupled into the system or may be incident in the longitudinal optical axis direction.

In a further refinement, the measuring apparatus contains a unit for calculation of error correction information from the imaging error information obtained by evaluation of the measurement results. The error correction information can be used during normal operation of the optical imaging system to entirely or partially compensate for the heating-dependent imaging errors by means of appropriate error correction measures.

This is achieved in a specific manner by the operating method of the invention in that the optical imaging system is first of all measured with the aid of the measuring apparatus according to the invention, with the heating-dependent imaging errors, in particular, also being taken into account during this process. In order to compensate for the latter, appropriate error correction information is calculated, by means of which the optical imaging system is then driven in the imaging mode using an appropriate error correction recipe or method, in order to entirely or partially compensate for the heating-dependent imaging errors. The heating-dependent imaging errors and, in a corresponding manner, the compensating error correction measures are preferably determined on a time-resolved basis, that is to say as a function of the time profile of the radiation load on the optical imaging system. If required, for the intended use of the error correction information at a different time from the determination of the imaging error information, it is possible to provide for the imaging error information obtained by evaluation of the measurement results to be stored, and for the error correction information to be determined from this at a later time, at which it is required for driving the imaging system or, alternatively, for the error correction information to be calculated from the imaging error information obtained, and for this to be stored, such that it can be called up, until it is required for imaging operation of the imaging system.

BRIEF DESCRIPTION OF PREFERRED EMBODIMENTS

Advantageous embodiments of the invention are described in the following and are illustrated in the drawings, in which.

DETAILED DESCRIPTION OF PREFERRED EMBODIMENTS

Figure 1:
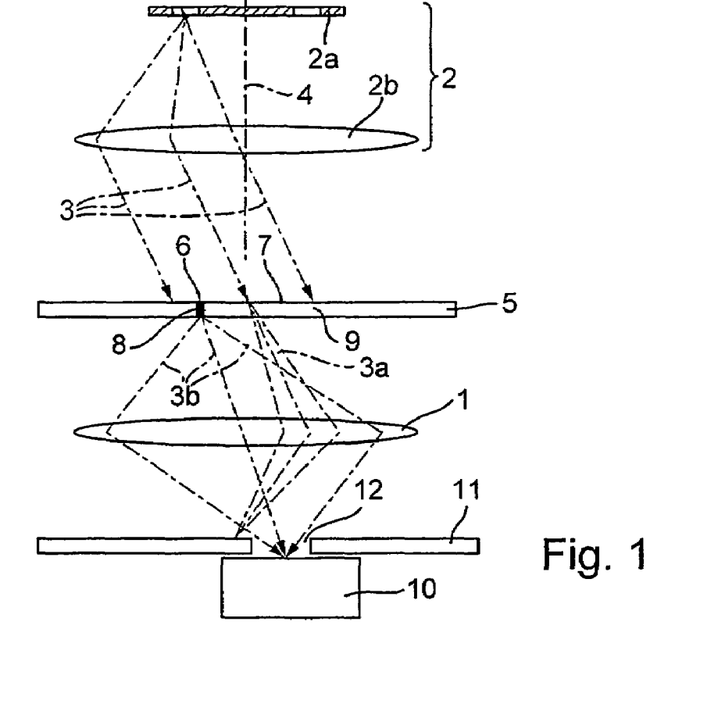
FIG. 1 shows a schematic side view of a measuring apparatus for interferometric measurement of an optical imaging system.

The measuring apparatus shown in FIG. 1 is used for interferometric measurement of an optical imaging system, which may, in particular, be a projection objective of a microlithography system and, for the sake of simplicity, is represented by an objective lens 1 in FIG. 1. The layout of the measuring apparatus is designed to carry out shearing interferometry measurements although, alternatively, it can also be used to carry out other conventional interferometric and non-interferometric measurement techniques, such as point diffraction interferometry or Shack-Hartmann measurement.

As can be seen from FIG. 1, on the object side of the imaging system 1 to be measured, the measuring apparatus contains a conventional illumination part 2, which produces partially coherent radiation 3 at a desired angle with respect to the optical axis 4. For this purpose, the illumination part 2 may, for example, include a light source which is not shown, a perforated diaphragm 2a and illumination optics 2b.

The illumination part 2 is followed by a mask 5, which is preferably positioned on the object plane of the imaging system 1. In the application of a lithography objective to be measured, the position of the mask 5 corresponds to the reticle place, on which a reticle with a useful pattern is arranged during normal exposure operation, in order to image this useful pattern on a wafer which is located on the image plane.

Within its effective, irradiated area, the mask 5 is provided with a measurement pattern 6 and a heating irradiation pattern 7. The measurement pattern 6 is limited to a small subarea 8, which is marked by a solid black area in FIG. 1, and is preferably less than about 1 cm$^2$, while the heating irradiation pattern 7 extends over the remaining effective mask area 9. It is self-evident that, depending on the requirement, the measurement pattern 6 and the heating irradiation pattern 7 may alternatively also be provided on two different masks which are placed alongside one another or one behind the other, in which case superimposition of the two patterns may also be tolerable, depending on the application, and, if required, the measurement pattern 6 may also be arranged on the image side rather than on the object side.

The measurement pattern 6 is chosen appropriately for carrying out the intended interferometric measurement, for example as a so-called coherence mask pattern for shearing interferometry measurements or as a pinhole pattern for point diffraction interferometry measurements. The heating irradiation pattern 7 is chosen such that the radiation component 3a passed by it leads to a heating, that is to say "lens-heating" effect for the imaging system 1 which essentially, that is to say within a tolerance range which can be predetermined, corresponds to that to which the imaging system 1 is subject by the radiation during normal imaging operation. As a criterion for this, the heating irradiation pattern 7 can be chosen such that it results in essentially the same radiation load for the imaging system 1 on a pupil plane as that which occurs during normal imaging operation. In the case of a lithography objective, this is the radiation load from an exposure process with a reticle which has a predetermined useful pattern. This criterion is ensured, for example, when the heating irradiation pattern 7 produces an identical diffraction pattern, within the scope of a predetermined tolerance range, in the pupil of the imaging system 1.

The illumination part 2 of the measuring apparatus preferably corresponds identically to that which is used in an illumination system for imaging operation of the imaging system 1. By way of example, the useful pattern which is chosen for the normal exposure process can be used identically as the heating irradiation pattern of the mask 5, just with the correspondingly small subarea in which the measurement pattern 6 is formed being cut out. Alternatively, a structure that is simpler than the useful pattern can be used as the heating irradiation pattern, having the same heating effect for the imaging system 1, within the tolerance range that can be predetermined. The tolerance range may, for example, in each case be predetermined as the upper and lower limit value for the radiation intensity or the temperature. If different useful patterns are intended to be imaged during normal operation of the imaging system 1, the heating irradiation pattern is preferably chosen such that, within the predetermined tolerance range, it represents the heating effect of a plurality of these useful patterns, or even of all of these useful patterns, so that only one heating irradiation pattern is required for an entire group of useful patterns. For many applications, it may be sufficient to use a periodic grating structure as the heating irradiation pattern, and this leads to very largely homogeneous pupil illumination.

On the image side of the imaging system 1, the measuring apparatus shown in FIG. 1 contains a detector and evaluation part or measuring head 10 which is matched to the type of measurement technique used and is arranged with a front-face detection plane, for example, on the image plane of the imaging system 1. A screening plate 11 is located in front of the measurement head 10 and has an opening 12 which passes only that light component 3b which originates from the measurement pattern 6 and which, in consequence, has the radiation information which is indicative of imaging errors, in this case in the form of interference information. The radiation component 3a which produces the heating effect is, in contrast, masked out, so that it does not additionally thermally load the measurement head 10, and does not interfere with the detection and evaluation of the interference information.

The interferometric measurement of the imaging system 1, which may, in particular, be a system with high-precision imaging characteristics and very high resolution, is used for high-precision determination of imaging errors in this system. For this purpose, the measurement system part on the object side preferably forms a so-called wavefront source, in which case the wavefront interference which occurs on the image side will then contain the sought imaging error information, which can be extracted from this by suitable evaluation of the detected interferograms.

Figure 2:
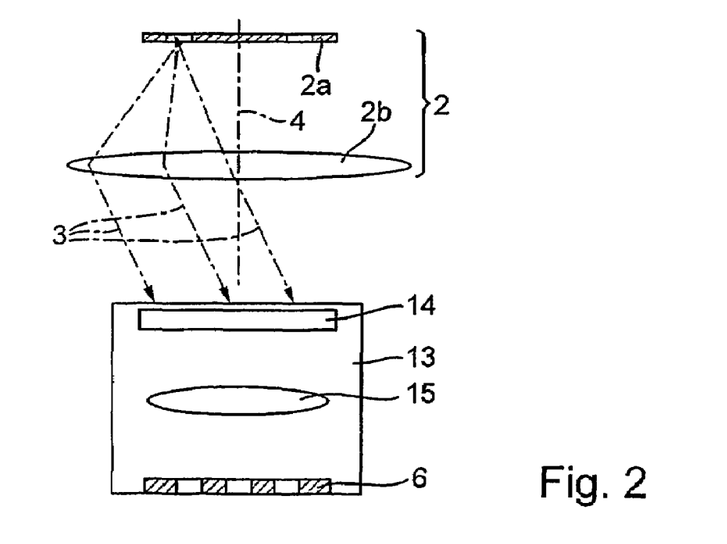
FIG. 2 shows a schematic side view of one possible implementation of a measurement system part, on the object side, of the measuring apparatus shown in FIG. 1.

The object-side measurement system layout as shown in FIG. 2 is suitable, for example, for provision of a wavefront source such as this, for that system part which is associated with the measurement pattern 6. In the example in FIG. 2, a binary coherence mask pattern is used as the measurement pattern 6, as can be used, in a known manner, for Shearing interferometry measurements. In this case, the measurement pattern 6 forms the outlet-side part of a so-called source or illumination module 13 which, furthermore, has an inlet-side diffusor 14 and imaging optics 15 between the diffusor 14 and the coherence mask pattern 6. The illumination module 13 is preferably arranged behind the illumination part 2 in such a way that the measurement pattern 6 is located at the same height as the object plane of the imaging system 1 to be measured, and has the function of providing the coherence mask measurement pattern 6 for the Shearing interferometry measurement in the measurement pattern subarea 8 of the mask 5, of destroying the spatial coherence on the object plane and of providing a radiation angle spectrum which illuminates the pupil of the imaging system 1 as homogeneously as possible. The imaging optics 15 are optional, and may be omitted in alternative embodiments of the illumination module.

The measuring apparatus as shown in FIGS. 1 and 2 can be used to detect on a time-resolved basis, to record and to store the wave aberrations that are produced by the heating effect, in each case for the field point which is defined by the measurement pattern subarea 8 of the mask 5, for example at intervals of a few seconds. In particular, the heating-dependent imaging errors of the imaging system 1 can be detected on a time-resolved basis even in the phase in which they are being created, since the imaging system 1 is actually not thermally loaded before the start of the measurement, but the thermal loading by means of the heating light component 3a which does not contribute to the interferometric measurement occurs at the same time as the interferometric measurement. The imaging error determination measurement can be carried out for any desired number of field points by lateral movement of the mask 5 and, in synchronism with this, of the measurement head 10 with the screening plate 11.

Figure 3:
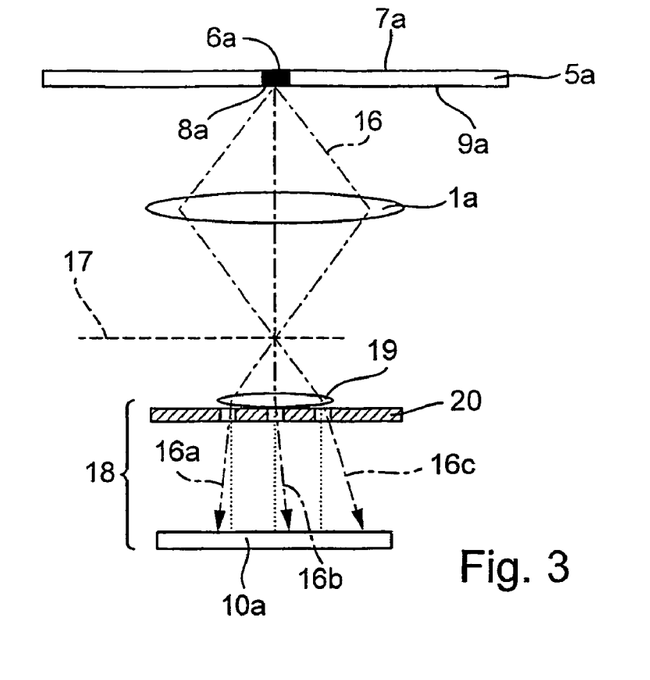
FIG. 3 shows a schematic side view of a part of a measuring apparatus for measurement of an optical imaging system based on the Shack-Hartmann principle.

FIG. 3 illustrates the use of the invention for a non-interferometric measurement method. In particular, FIG. 3 shows, schematically, a Shack-Hartmann measurement arrangement of essentially conventional design, illustrating only the system part that is of interest here, from a mask 5a to a detector plane 10a. This system part is preceded by a conventional illumination system part, for example of a type as explained above with reference to FIG. 2. The arrangement shown in FIG. 3 once again allows, for example, the aberrations of a projection objective 1a of a microlithographic projection exposure system or of any other optical imaging system to be measured. The mask 5a corresponds to the mask 5 in the example shown in FIG. 1, with the difference that, as a measurement pattern, it contains a conventional Shack-Hartmann opening 6a without any further structuring in a corresponding, relatively small measurement pattern subarea 8a, while a heating irradiation pattern 7a extends over the remaining effective mask area 9a. The heating irradiation pattern 7a corresponds to the heating irradiation pattern 7 in the example shown in FIG. 1, so that reference can be made to the above statements relating to the heating irradiation pattern 7 as shown in FIG. 1 for its possible implementations and characteristics. For the sake of clarity, FIG. 3 shows only a beam profile 16 passing through the Shack-Hartmann mask opening 6a, although it is self-evident that the mask 5a is illuminated by the upstream illumination part over its entire effective area, that is to say also in the area 9a where the heating irradiation pattern 7a is located, during the measurement process, in order to take account of the heating effect caused by the representative heating irradiation pattern 7a, as explained above with reference to FIG. 1.

On the image side, the measuring apparatus shown in FIG. 3 and based on the Shack-Hartmann principle contains, downstream from an image 17 of the unit under test, for example the wafer plane of a microlithographic projection objective, a Shack-Hartmann sensor 18 with a microobjective 19 for collimation of the measurement radiation 16, a perforated diaphragm or microlens field 20 for selection of sub-pupil areas of the unit under test 1a, and a detector element with the detector plane 10a that has been mentioned. On the basis of the Shack-Hartmann method, the horizontal deflection of individual sub-pupil beam bundles 16a, 16b, 16c from their ideal position, in each case marked by dots in FIG. 3, is detected. In the case of this non-interferometric measurement method, the aberrations of the unit under test 1a are then derived from this, as in the case of FIG. 3, as stated, on the basis of the heating irradiation pattern 7a that is used, with realistic consideration of the "lens heating" effect. The detected radiation information, which is indicative of imaging errors, is evaluated by suitable evaluation algorithms, which are known per se for the various interferometric and non-interferometric measurement techniques and therefore do not need to be explained in any more detail here. Specifically, the aberrations induced by the heating effect can be described in this context by means of the time-dependent measurement, as explained above, at a sufficient number of field points by means of appropriately field-dependent and time-dependent Zernike coefficients.

Since the heating irradiation pattern 7 that is used in the measurement process is chosen such that it results in virtually the same radiation load and thus the same heating effect as in the case of the corresponding useful pattern or patterns which is or are used during normal imaging operation, and in consequence results in the same heating-dependent changes to the imaging characteristics of the imaging system 1, the imaging errors which are determined on a time-resolved basis in the measurement process for the respective field point are the same as those which occur during normal imaging operation, in which, in particular, the changes in the imaging characteristics caused by the radiation load are also taken into account on a position-resolved and time-resolved basis. In consequence, the imaging error information obtained on a position-resolved and time-resolved basis in the measurement process can be used for correction measures during subsequent, normal imaging operation. By way of example, the manufacturer of a projection objective for a microlithography system can record the appropriate imaging error information, which takes account of radiation load influences on a position-resolved and time-resolved basis, on a test rig, so that this information can be used later at the point of use in a microlithography system to provide a corrective and compensating drive for the projection objective. This makes it possible, for example, to entirely or partially correct spherical aberration, caused by heating, during wafer exposure, for which purpose various manipulators of the projection objective are readjusted continuously on the basis of the time-resolved aberration information previously recorded by measurement.

Figure 4:
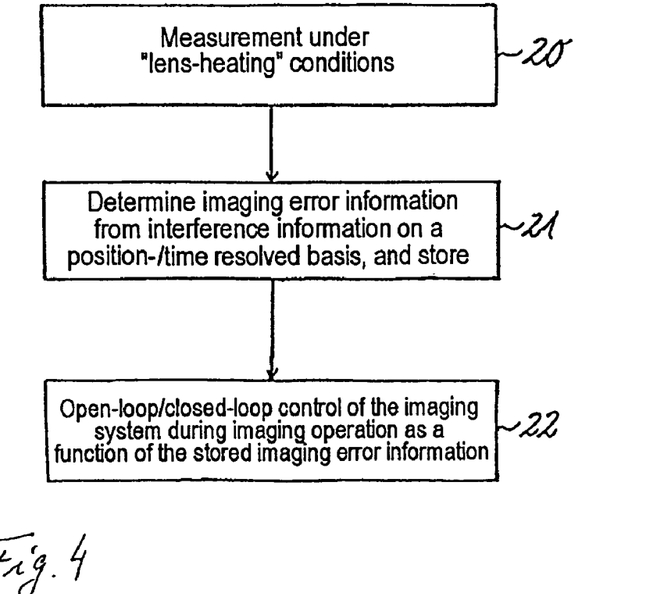
FIG. 4 shows a flowchart of a method for operation of an optical imaging system, including image error correction.

FIG. 4 shows a method for operation of an optical imaging system, including image error correction, in the form of a schematic flowchart. As can be seen from FIG. 4, the imaging errors of an optical imaging system are measured in a first step 20 by means of a suitable measuring apparatus according to the invention, such as one of those shown in FIGS. 1 to 3. In a next step 21, the time-resolved and position-resolved imaging error information that is sought is determined from the radiation information which was recorded by the measurement process and is indicative of imaging errors, and is stored such that it can be called up.

In the case of the intended use of the optical imaging system for normal imaging operation, the stored imaging error information is then called up and is used to derive error correction information, which is used for open-loop or closed-loop control of the imaging behavior on one or more imaging-active components (whose imaging behavior can be varied in a controllable manner) of the optical imaging system, in such a way that the imaging errors that occur are entirely or partially compensated for, in particular including the fluctuations in the imaging behavior (step 22) caused by the "lens-heating" effect. In the case of a projection objective used in a microlithography scanner, for example, it is thus possible to carry out permanent readjustment, inter alia of z-manipulators, for correction of spherical aberration during wafer exposure, on the assumption that the aberration is caused by the heating effect and fluctuates over time in a corresponding manner.

As an alternative to the procedure described above of deriving the error correction information from the stored imaging error information at a time at which it is required for open-loop or closed-loop control of correction of the imaging system 1, it is also possible for the error correction information to be derived from the imaging error information obtained by the evaluation of the radiation information which is indicative of imaging errors, and for this information to be stored until it is required for imaging error correction during imaging operation.

So far embodiments have been described with respect to FIGS. 1 to 3 in which the measurement radiation and the heating irradiation is provided by a common illumination source, the heating irradiation being generated by using the heating irradiation pattern which is preferably provided together with the measurement pattern on a single mask. The measurement radiation and the heating irradiation are thus both directed along the longitudinal direction of the system, i.e. the direction of the optical system axis, passing the optical imaging system to be measured from its object side to its image side. Various alternative embodiments of the measuring apparatus of the invention are also possible, and FIGS. 5 to 8 show some illustrative examples. For convenience sake the same reference numbers are used in FIGS. 5 to 8 as in FIGS. 1 to 3 for identical or functionally equivalent elements and a repeated explanation thereof is avoided here.

As a feature common to the embodiments of FIGS. 5 to 8 the heating irradiation arrangement comprises a beam-shaping assembly 30 configured to generate a heating irradiation beam 31 which, in the measurement operation, properly simulates the lens-heating effect of the useful pattern used in the normal imaging operation. In other words, the heating irradiation beam-shaping assembly 30 fully replaces the function of the heating irradiation pattern used in the embodiments of FIGS. 1 to 3. To this end the beam-shaping assembly 30 is designed to adjust the heat irradiation beam 31 accordingly, in particular with respect to angle distribution and thus spatial coherence as well as field-dependent intensity of the beam rays, so that the heating effect of the heating irradiation beam 31 in the measurement operation equals, within the predetermined tolerance range, the heating effect of the imaging radiation provided by the useful pattern in the normal imaging operation of the imaging system 1. This may include to monitor in advance a typical angular distribution and field-dependent intensity of any useful patterns used in the normal imaging operation and adjust the beam-shaping assembly 30 to simulate the same heating effect caused by this imaging radiation on the imaging system 1 by providing the heating irradiation beam 31 with quite the same angle distribution and field-dependent intensity of the beam rays. It is thus sufficient in these embodiments that the mask 5 comprises the measurement pattern 6 to generate the measuring radiation 3b.

The heating irradiation beam-shaping assembly 30 may substantially be of a conventional illumination source construction, while including specific beam-shaping elements such as a heating irradiation diaphragm 30a placed in an object plane and a variable light-transmitting element 30b placed in a pupil plane of an objective part of the beam-shaping assembly 30 to appropriately adjust the angle distribution and the field-dependent intensity of the beam rays. Any conventional beam-forming means can be used in the beam-forming assembly 30 e.g. for the elements 30a and 30b, such as hologram elements, diaphragms, diffractive optical elements, filter elements, mirror arrays and/or moveable mirrors.

Figure 5:
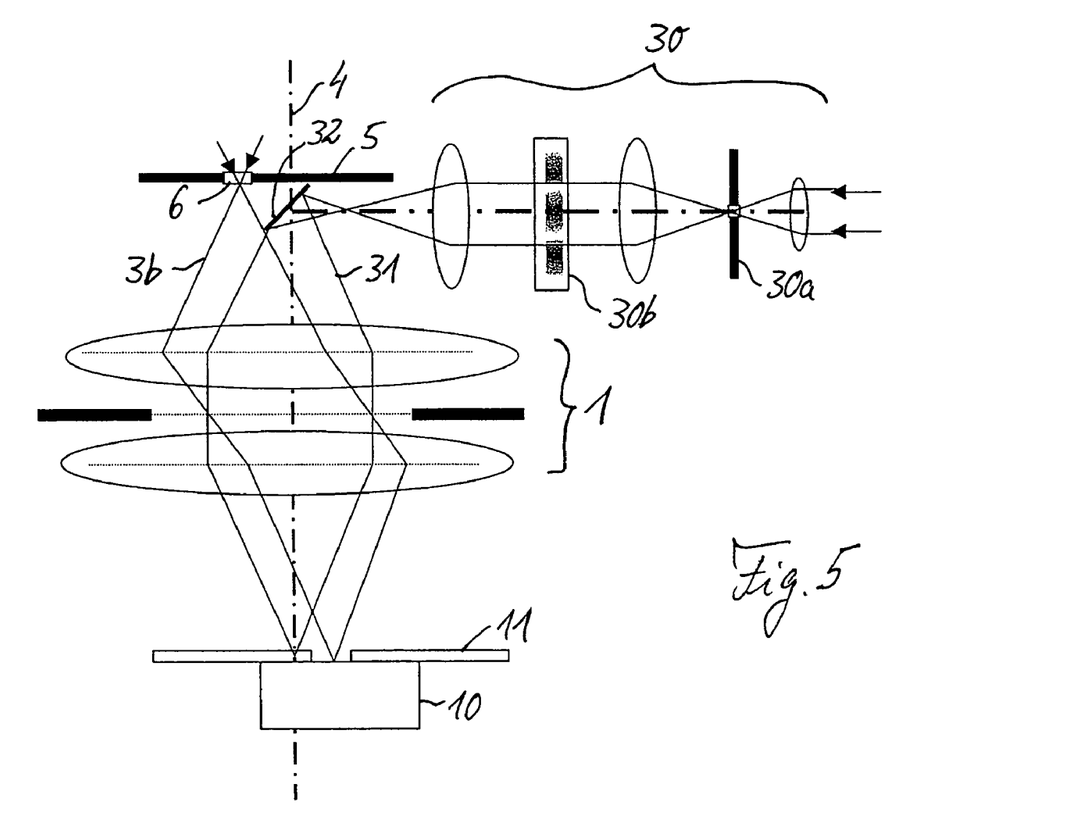
FIG. 5 shows a variation of the measuring apparatus of FIG. 1 with beam-shaped heating irradiation coupled laterally into the system on the object side.

In the embodiment of FIG. 5 the measurement radiation 3b is directed through the imaging system 1 to be measured in the longitudinal direction parallel to the optical system axis 4 from the object side to the image side of the imaging system 1. The heating irradiation beam 31 is also directed through the imaging system 1 from its object side to its image side, but laterally coupled into the system by using a deflection or scan mirror 32, as shown. The deflection mirror 32 is placed in the optical path behind the mask 5 so as not to block the measurement radiation 3b in a substantially 45° orientation.

Alternative means can be used instead of the deflection mirror 32 to achieve the desired lateral coupling of the heating irradiation 31 into the system between the mask 5 and the imaging system 1, such as a beam dividing element, a pellicle element or the like.

In an arrangement like that of FIG. 5 it is possible to simulate a scanning mode of the heating irradiation. This is in particular suited for simulating the heating effect of the normal imaging radiation in a wafer exposure system of the scanner type. In this scanning mode the heating irradiation beam 31 may be scanned through the total image region by correspondingly moving the beam-deflecting element, such as the scan mirror 32.

In the embodiments using the beam-shaping assembly 30 for lens-heating simulation during measurement operation, as an alternative of simultaneously applying the heating irradiation 31 and the measurement radiation 3b an alternate operation mode may be provided by which the measurement radiation 3b and the lens-heating simulating beam 31 are alternately applied in time by switching between measurement radiation illumination and lens-heating beam illumination. This switching may be done e.g. by alternately activating and deactivating the corresponding light sources or by using a modified scan or deflection mirror instead of the deflection mirror 32. This modified scan mirror is movably arranged such that it can rapidly be switched between a first position in which the measurement radiation 3b is blocked while directing the lens-heating beam 31 to the imaging system 1, and a second position in which the lens-heating beam 31 is blocked while the measurement radiation 3b is allowed to enter the imaging system 1.

As seen from FIG. 5 when compared with FIG. 1 the embodiments using the heating beam-shaping assembly 30 avoid the need to separate the lens-heating irradiation and the measurement radiation by using different field points as accomplished in FIG. 1 by using different areas of the mask 5 for generating the measurement radiation 3b and the lens-heating irradiation 3a. In addition this allows for multi-channel measurements at a plurality or all of the field points considered.

As another advantage the use of the separate assembly 30 for providing the lens-heating simulation beam 31 allows an extended freedom for generating the heating irradiation. For example, the heating irradiation 31 may use a different wavelength, a different wavelength spectral distribution, a different pulse frequency, a different pulse form and/or a different pulse length compared to the measurement radiation and also compared to the useful radiation used during normal imaging operation. For example, a less complex light source, a higher energy dose, and/or a shorter irradiation duration may be used for the lens-heating simulation beam 31.

Figure 6:
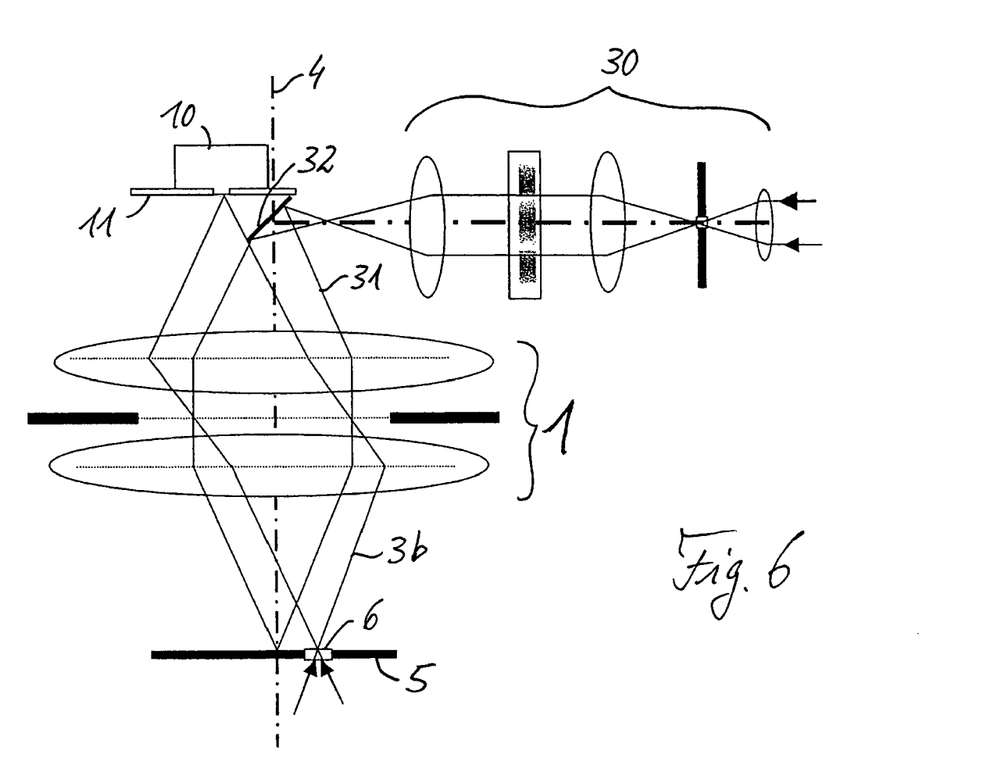
FIG. 6 shows a variation of the measuring apparatus of FIG. 5 with measuring radiation directed from the image side to the object side.

The use of the separate heating beam-shaping assembly 30 further allows for variations of the directions in which the measurement radiation 3b and the lens-heating beam 31 are directed through the imaging system 1 in the measurement operation. In this respect FIG. 6 shows an embodiment basically corresponding to that of FIG. 5, but with the direction of the measurement radiation 3b inverted. In detail, in the embodiment of FIG. 6 the mask 5 with the measurement pattern 6 is arranged on the image side of the imaging system 1, while the measuring head 10 and the associate screen plate 11 are positioned on the object side of the optical imaging system 1. Therefore, in this embodiment the measurement radiation 3b is directed through the imaging system 1 from its image side to its object side, whereas the lens-heating simulation beam 31 is directed through the imaging system 1 from its object side to its image side.

Figure 7:
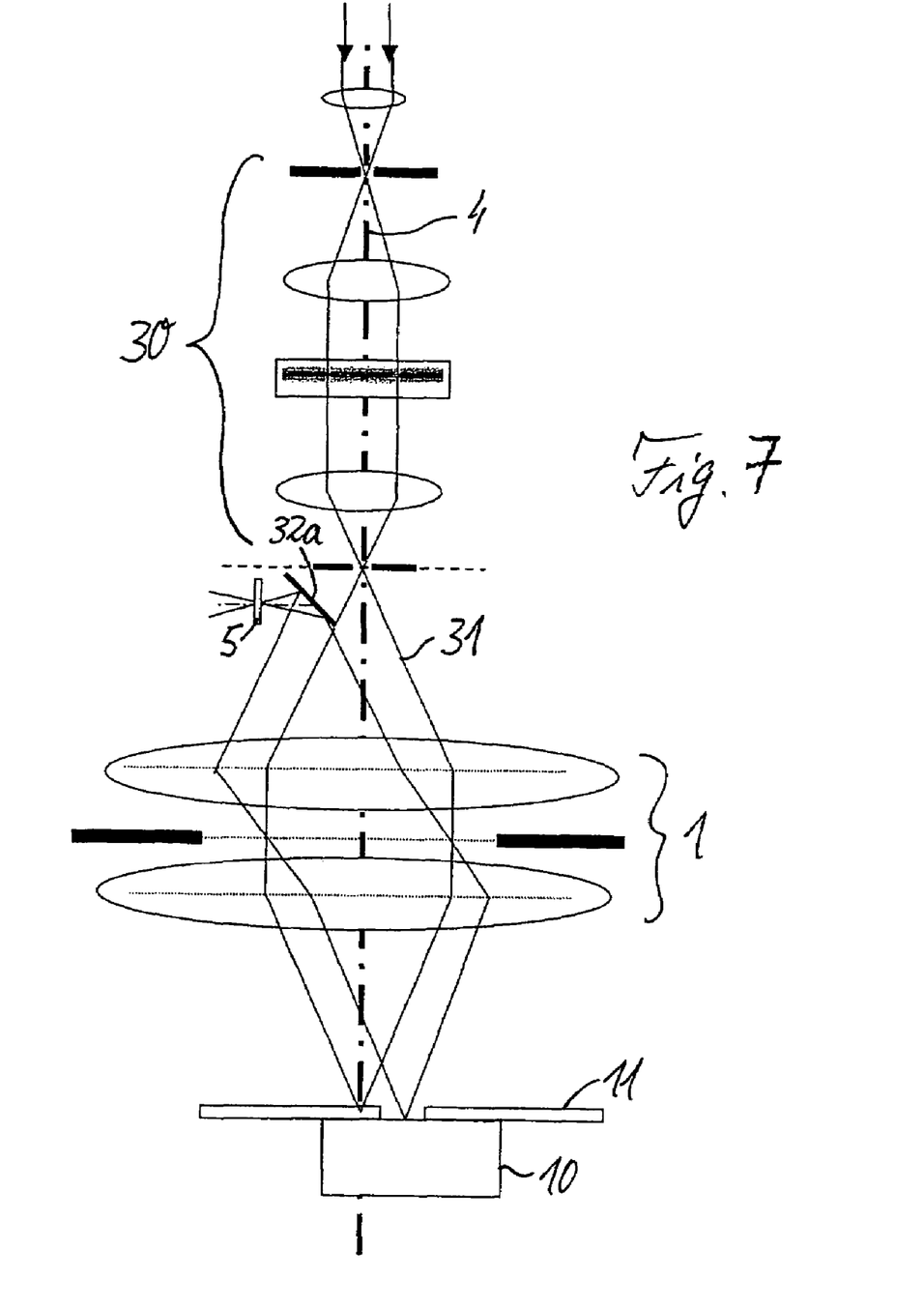
FIG. 7 shows a variation of the measuring apparatus of FIG. 5 including different polarization for measuring radiation and heating irradiation, respectively.

In the further embodiment as shown in FIG. 7 the lens-heating beam-shaping assembly 30 is arranged like a usual illumination source in the normal imaging operation, i.e. on the object side of the imaging system 1 along its optical axis 4. Further, the measurement radiation 3b is laterally coupled into the system by using a deflection or scan mirror 32a which deflects the measurement radiation laterally emitted from the mask to pass through the imaging system 1 from its object side to its image side. In this case the mask 5 is 5 positioned laterally displaced from the optical system axis 4 and with its mask plane parallel thereto.

Figure 8:
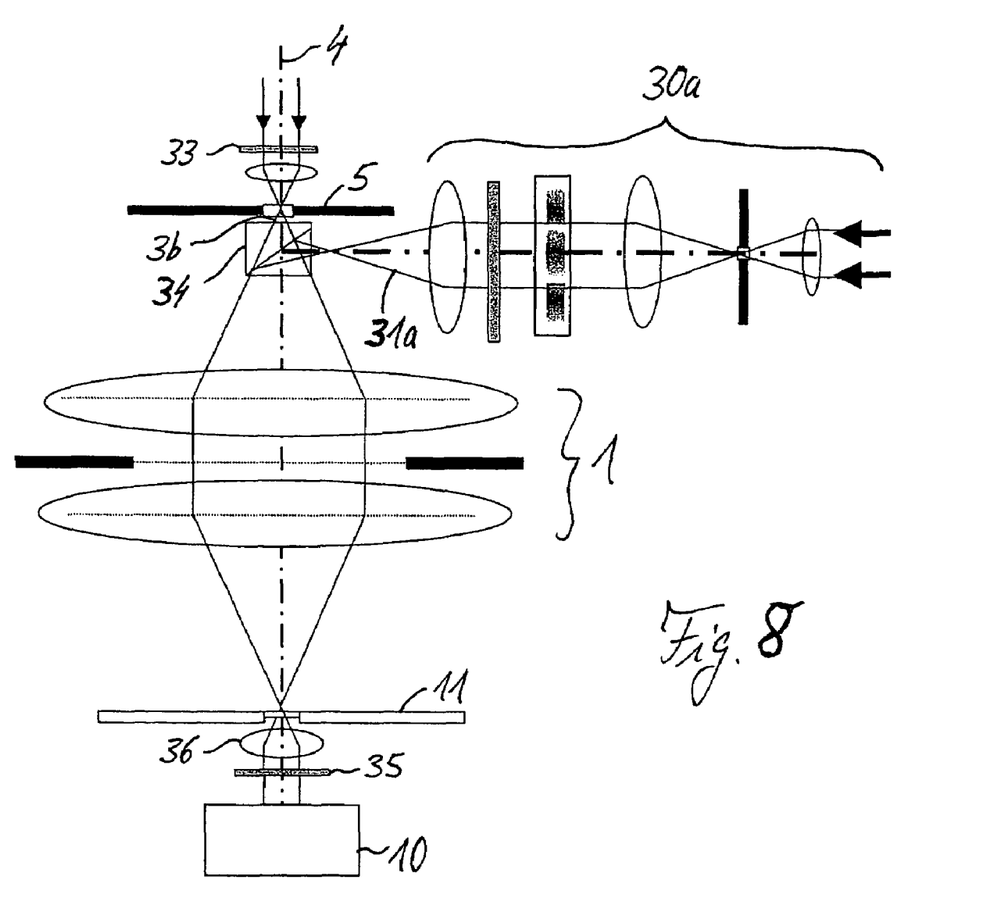
FIG. 8 shows a variation of the measuring apparatus of FIG. 1 with measuring radiation laterally coupled into the system on the object side.

While in the embodiments described above the lens-heating irradiation is separated from the measurement radiation in front of the measuring head 10 by lateral displacement and the use of the screening plate 11, the invention also covers other types of blocking the lens-heating irradiation from entering the measuring head 10 in the measuring operation. A corresponding embodiment is shown in FIG. 8. In this embodiment the separation of the heating irradiation from the measuring radiation is achieved by using different polarizations and appropriate polarizing elements. Basically the embodiment of FIG. 8 corresponds to that of FIG. 6, while using a modified beam-shaping assembly 30a designed to produce a heating irradiation beam 31a with a specific first polarization, e.g. a linear polarization in an x-direction. On the other hand the measurement radiation 3b is generated with a definite other, second polarization, such as a linear polarization in an y-direction orthogonal to the x-direction by using a corresponding polarizing filter 33 e.g. before the mask 5.

Due to using different polarizations, the measurement radiation 3b and the heating irradiation 31a can be directed through the imaging system 1 in common, i.e. within the same field region, from the object side to the image side. To this end the illumination source of the measurement radiation 3b is provided along the optical system axis 4, and a beam splitting cube element 34 is used behind the mask 5 to pass the specifically polarized measurement radiation 3b and at the same time to deflect the differently polarized heating irradiation 31a. A polarizing cube element can be used instead of the beam splitting cube element 34 to achieve the desired coinciding illumination of the imaging system 1 by the measurement radiation 3b and the differently polarized heating irradiation 31a.

Another polarizing filter 35 is placed in front of the measuring head 10 and behind an optional measuring optics 36 to block the heating irradiation 31a from entering the measuring head 10 while allowing the differently polarized measuring radiation 3b to enter the measuring head 10.

In variations of the embodiment of FIG. 8 other polarization states may be used for the heating irradiation 31a and/or the measuring radiation 3b as far as they are chosen such that the heating irradiation 31a is blocked from reaching the measuring head 10. For example, the measurement radiation polarization filter 33 may be avoided, while a definite polarization state is chosen for the heating irradiation 31a, and the polarization filter 35 in front of the measuring head 10 is appropriately adjusted so as to block the heating irradiation 31a. In this case the measuring radiation component having a polarization state different from that of the heating irradiation 31a passes the polarization filter 35 and enters the measuring head 10.

If needed, any influence of the beam dividing element 34 on the measurement imaging can be computationally corrected from the measurement result or may be compensated by varying appropriate geometrical parameters of the measurement assembly, or combining both measures, as will be understood by one skilled in the art.

Depending on the requirement, the measuring apparatus which is used for measuring the imaging system, e.g. in any of the embodiments described above, may be designed as an autonomous apparatus or may be integrated in the system for which the imaging system is intended. In the case of the integrated version, the same illumination part can be used for measurement on the one hand and for normal imaging operation on the other hand, thus automatically to this extent guaranteeing identical illumination conditions. In the application of a wafer scanner corresponding to the device shown in FIG. 1 or 3, all that is necessary when changing from measurement to the normal wafer exposure mode and vice versa is to replace the measurement mask unit and/or the illumination module on the object side by a useful pattern reticle, and to replace the measurement head on the image side by a wafer to be exposed. In any case, both in the case of the integrated version and in the case of the autonomous version, the heating-dependent image error influences can be detected on a time-resolved basis immediately after the start of an imaging or exposure process, and can likewise be corrected by negative feedback on a time-resolved basis. It is self-evident from the above statements that the procedure according to the invention can be carried out not only with different heating radiation patterns but also with different so-called "illumination settings", that is to say different illumination system parts and illumination wavelengths.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. A measuring apparatus for optical measurement of an optical imaging system, which is intended for imaging of a useful pattern in an imaging operation, comprising:
    a device producing radiation information which is indicative of imaging errors in a measurement operation, having a mask structure arrangement which contains a measurement pattern, different from the useful pattern, to provide measurement radiation,
    a detection and evaluation device detecting and evaluating the radiation information which is indicative of imaging errors, and
    a heating irradiation arrangement heating the optical imaging system during measurement operation such that the heating effect of the radiation applied to the optical imaging system to be measured equals, within a predetermined tolerance range, the heating effect of the radiation which is passed through the useful pattern during the imaging operation of the optical imaging system.

2. The measuring apparatus of claim 1, wherein the heating irradiation arrangement comprises a mask structure element which contains a heating irradiation pattern selected such that the heating effect of the radiation passed through the irradiation pattern for the optical imaging system to be measured equals, within the predetermined tolerance range, the heating effect of the radiation which is passed through the useful pattern during the imaging operation of the optical imaging system.

3. The measuring apparatus of claim 2, wherein the mask structure arrangement contains a mask on which the measurement pattern and the heating irradiation pattern are provided jointly.

4. The measuring apparatus of claim 1, wherein the heating irradiation arrangement comprises a beam-shaping assembly adapted to generate a heating irradiation beam having an angle distribution and field-dependent intensity so as to correspond in heating effect on the optical system to be measured to the radiation which is passed through the useful pattern during the imaging operation of the optical imaging system.

5. The measuring apparatus of claim 4, wherein
    the heating irradiation beam-shaping assembly comprises at least one of a hologram element, a diaphragm, a diffractive optical element, a filter element, a mirror array element, and a moveable mirror element; and
    the heating irradiation beam-shaping assembly adjusts at least one of an angle distribution of radiation passing therethrough and a field-dependent intensity of radiation passing therethrough.

6. The measuring apparatus of claim 1, wherein the heating irradiation arrangement comprises a heating irradiation light source adapted to generate the heating irradiation to differ from at least one of the measurement radiation and the radiation used during the normal imaging operation in at least one of wavelength, wavelength spectrum, pulse frequency, pulse shape, and pulse length.

7. The measuring apparatus of claim 1, wherein the radiation heating arrangement is selected to produce a diffraction pattern in a pupil plane of the optical imaging system to be measured, which corresponds, within a predetermined tolerance range, to the diffraction pattern which is produced on the pupil plane during normal imaging operation by the useful pattern.

8. The measuring apparatus of claim 1, further comprising a switching device to pass the measurement radiation and the heating irradiation alternately in time through the optical imaging system in the measurement operation.

9. The measuring apparatus of claim 8, wherein the switching device comprises a movable optical element adapted to be moved between a first position in which the optical element blocks the measurement radiation and directs the heating irradiation to the optical imaging system, and a second position in which the optical element blocks the heating irradiation and directs the measurement radiation to the optical imaging system.

10. The measuring apparatus of claim 1, further comprising a polarization arrangement adapted to generate the measurement radiation and the heating irradiation with different polarization states and including a polarizing element in front of the detection and evaluation device for blocking the heating irradiation and at least partly transmitting the measurement radiation.

11. The measuring apparatus of claim 1 further comprising a screen arrangement in front of the detection and evaluation device to pass a radiation component coming from the measurement pattern and block radiation coming from the heating irradiation arrangement.

12. The measuring apparatus of claim 1, wherein the heating irradiation arrangement comprises a heating irradiation supply unit adapted to laterally couple heating radiation into the optical imaging system on an object side or an image side thereof.

13. The measuring apparatus of claim 1, wherein the device for production of radiation information comprises a measurement radiation supply unit adapted to laterally couple the measurement radiation into the optical imaging system on an object side or an image side thereof.

14. The measuring apparatus of claim 13, wherein
    the device producing radiation information further comprises a heating irradiation supply unit; and
    a light-deflecting element to deflect laterally incoming radiation in an outgoing direction substantially parallel to an optical axis of the optical imaging system is comprised within at least one of the heating irradiation supply unit and the measurement radiation supply unit.

15. The measuring apparatus of claim 12, wherein
    the device producing radiation information further comprises a measurement radiation supply unit; and
    a light-deflecting element to deflect laterally incoming radiation in an outgoing direction substantially parallel to an optical axis of the optical imaging system is comprised within at least one of the heating irradiation supply unit and the measurement radiation supply unit.

16. The measuring apparatus of claim 1, wherein the detection and evaluation device comprises a unit for calculation of error correction information from the imaging error information obtained by evaluation of the radiation information which is indicative of imaging errors, with the error correction information being used for open-loop or closed-loop control of the optical imaging system during normal imaging operation with the useful pattern, in order to correct imaging errors.

17. A method for operation of an optical imaging system including imaging error correction, comprising:

providing measurement radiation using a measurement pattern, and optically measuring the optical imaging system and determining radiation dependent imaging error information by a measuring apparatus and, thereafter imaging a useful pattern, different from the measurement pattern, by the optical imaging system, wherein the imaging comprises controlling the imaging system with one of open-loop control and closed-loop control, thus correcting imaging errors as a function of the imaging error information which is determined in the measurement step, and wherein the imaging error information is dependent on the radiation heating.

* * * * *